United States Patent
Kim et al.

(10) Patent No.: US 9,772,532 B2
(45) Date of Patent: Sep. 26, 2017

(54) ELECTROSTATIC DISCHARGE CIRCUIT AND LIQUID CRYSTAL DISPLAY DEVICE INCLUDING THE SAME

(71) Applicant: LG Display Co., Ltd., Seoul (KR)

(72) Inventors: Sang Woon Kim, Goyang-si (KR); Sang Hee Yu, Paju-si (KR); Hoon Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 252 days.

(21) Appl. No.: 14/643,756

(22) Filed: Mar. 10, 2015

(65) Prior Publication Data

US 2015/0255449 A1 Sep. 10, 2015

Related U.S. Application Data

(60) Provisional application No. 61/950,675, filed on Mar. 10, 2014.

(30) Foreign Application Priority Data

Jun. 16, 2014 (KR) ........................ 10-2014-0073014

(51) Int. Cl.
*G02F 1/136* (2006.01)
*G02F 1/1362* (2006.01)
*H01L 27/02* (2006.01)
*G09G 3/36* (2006.01)

(52) U.S. Cl.
CPC ...... *G02F 1/136204* (2013.01); *G09G 3/3648* (2013.01); *H01L 27/0266* (2013.01); *G09G 2330/04* (2013.01)

(58) Field of Classification Search
CPC ............ G02F 1/136204; G02F 1/1345; G02F 1/1368; G02F 2001/133388; H01L 27/0266; H01L 27/1225; H01L 27/1214; H01L 29/7869; H01L 29/66765; H01L 29/78669; H01L 21/02565; H01L 27/1251; H01L 27/127
See application file for complete search history.

(56) References Cited

U.S. PATENT DOCUMENTS

| | | | | |
|---|---|---|---|---|
| 6,392,622 | B1 * | 5/2002 | Ozawa | G02F 1/136204 345/92 |
| 2006/0119757 | A1 * | 6/2006 | Tsao | G02F 1/136204 349/40 |
| 2015/0021595 | A1 * | 1/2015 | In | H01L 27/1225 257/43 |
| 2016/0155736 | A1 * | 6/2016 | Kim | G02F 1/1345 257/43 |

\* cited by examiner

*Primary Examiner* — Huyen Ngo
(74) *Attorney, Agent, or Firm* — Fenwick & West LLP

(57) ABSTRACT

Disclosed is an electrostatic discharge (ESD) protection circuit. The ESD protection circuit includes a transistor structure having at least five thin film transistors (TFTs), said transistor structure configured in view of changes in operating characteristics that depend on a channel length of a back channel etched (BCE) type oxide transistor.

17 Claims, 8 Drawing Sheets

FIG. 13

| Reference | 1st ESD circuit Add Tr. | 2nd ESD circuit Add Tr. | STATIC CURRENT IN Off(Vdl) | | | STATIC CURRENT IN On(Vdh) | | |
|---|---|---|---|---|---|---|---|---|
| | | | Vth = 3 | Vth = 0v | Vth = 3 | Vth = -3 | Vth = 0v | Vth = 3 |
| Reference | 3Tr | 3Tr | -3.20E-10 | -5.43E-10 | -3.58E-10 | -2.09E-08 | -1.75E-08 | -1.15E-08 |
| 1 | 5Tr_Center Tr Length_16um | 7Tr Center Tr 8um | -3.21E-09 | -2.21E-09 | -1.58E-09 | -1.52E-07 | -1.49E-07 | -4.45E-08 |
| 2 | | 7Tr Center Tr 16um | -2.67E-09 | -2.12E-09 | -8.83E-10 | -1.24E-07 | -1.02E-07 | -2.13E-09 |
| 3 | | 7Tr Center Tr 24um | -2.45E-09 | -1.27E-09 | -4.16E-10 | -1.13E-07 | -4.20E-08 | -8.32E-11 |
| 4 | | 7Tr Center Tr 32um | -2.33E-09 | -7.57E-10 | -3.56E-11 | -1.07E-07 | -1.97E-08 | -8.86E-11 |
| 5 | | 7Tr Center Tr 40um | -2.26E-09 | -5.18E-10 | -8.75E-12 | -1.03E-07 | -1.51E-08 | -6.60E-11 |
| 6 | | 7Tr Center Tr 48um | -2.20E-09 | -3.58E-10 | -3.61E-11 | -1.00E-07 | -1.26E-08 | -1.66E-10 |
| 7 | 5Tr_Center Tr Length_24um | 7Tr Center Tr 8um | -2.96E-09 | -1.58E-09 | -1.16E-09 | -1.39E-07 | -1.15E-07 | -1.12E-08 |
| 8 | | 7Tr Center Tr 16um | -2.50E-09 | -1.68E-09 | -6.73E-10 | -1.16E-07 | -7.40E-08 | -1.38E-09 |
| 9 | | 7Tr Center Tr 24um | -2.31E-09 | -9.74E-10 | -2.91E-10 | -1.06E-07 | -3.42E-08 | -1.03E-10 |
| 10 | | 7Tr Center Tr 32um | -2.20E-09 | -6.19E-10 | -5.63E-12 | -1.01E-07 | -1.74E-08 | -6.89E-11 |
| 11 | | 7Tr Center Tr 40um | -2.13E-09 | -4.32E-10 | -3.19E-12 | -9.72E-08 | -1.39E-08 | -5.68E-11 |
| 12 | | 7Tr Center Tr 48um | -2.09E-09 | -3.10E-10 | -3.97E-12 | -9.46E-08 | -1.17E-08 | -4.45E-11 |
| 13 | 5Tr_Center Tr Length_32um | 7Tr Center Tr 8um | -2.83E-09 | -1.24E-09 | -8.77E-10 | -1.31E-07 | -7.37E-08 | -1.27E-09 |
| 14 | | 7Tr Center Tr 16um | -2.40E-09 | -1.29E-09 | -5.47E-10 | -1.11E-07 | -3.90E-08 | -1.11E-10 |
| 15 | | 7Tr Center Tr 24um | -2.22E-09 | -7.81E-10 | -2.29E-10 | -1.02E-07 | -2.30E-08 | -1.16E-10 |
| 16 | | 7Tr Center Tr 32um | -2.12E-09 | -5.20E-10 | -4.79E-12 | -9.70E-08 | -1.39E-08 | -9.96E-11 |
| 17 | | 7Tr Center Tr 40um | -2.06E-09 | -3.69E-10 | -4.91E-12 | -9.38E-08 | -1.14E-08 | -1.70E-10 |
| 18 | | 7Tr Center Tr 48um | -2.02E-09 | -2.78E-10 | -4.13E-12 | -9.14E-08 | -9.8E-09 | -6.39E-11 |

ELECTROSTATIC DISCHARGE CIRCUIT AND LIQUID CRYSTAL DISPLAY DEVICE INCLUDING THE SAME

CROSS-REFERENCE TO RELATED APPLICATIONS

This application claims the benefit of the U.S. Patent Application No. 61/950,675 filed on Mar. 10, 2014, and Korean Patent Application No. 10-2014-0073014 filed on Jun. 16, 2014, which are hereby incorporated by reference as if fully set forth herein.

BACKGROUND

Field of the Invention

The present invention relates to an electrostatic discharge (ESD) circuit and a liquid crystal display (LCD) device including the same.

Discussion of the Related Art

LCD devices are suitable as a display device for televisions (TVs) and portable devices because the LCD devices are easily manufactured due to the advance of manufacturing technology and realize drivability of a driver, low power consumption, and a high-quality image. The LCD devices adjust a transmittance of light passing through a liquid crystal layer of a pixel according to an image signal input from the outside to display an image based on the image signal.

The LCD devices include a liquid crystal panel, in which a plurality of pixels are arranged in a matrix type and which displays an image, and a driving circuit unit that supplies signals and power for driving the liquid crystal panel.

When static electricity or an overvoltage is supplied to a pixel, the pixel and a line are broken down, and for this reason, the LCD devices cannot normally display an image. In order to overcome a problem caused by an inflow of the static electricity or the overvoltage, a data line and a gate line are connected to an ESD circuit in parallel.

A general antistatic circuit limits an overvoltage input from the outside, and diverts an overvoltage current, thereby protecting a thin film transistor (TFT) array. In the antistatic circuit, an operation of a panel should not be affected by voltage drop or a static current which occurs in the operation of the panel. On the other hand, when an overvoltage based on static electricity occurs, a turn-on time should be fast because a resistance of the antistatic circuit is low.

When static electricity occurs, an ESD circuit disperses the static electricity, thereby protecting a TFT array in an active area. When high-voltage static electricity occurs, the antistatic circuit first senses an electrostatic signal, and diverts an overvoltage current to a ground (GND) or a common voltage (Vcom) terminal.

SUMMARY

Accordingly, the present invention is directed to provide an electrostatic discharge (ESD) circuit and a liquid crystal display (LCD) device including the same that substantially obviate one or more problems due to limitations and disadvantages of the related art.

An aspect of the present invention is directed to provide an ESD circuit and an LCD device including the same, which decrease a static current.

Another aspect of the present invention is directed to provide an ESD circuit and an LCD device including the same, which decrease consumption power.

Another aspect of the present invention is directed to provide an ESD circuit and an LCD device including the same, which decrease a circuit area and enhance electrostatic discharge performance.

Another aspect of the present invention is directed to provide an ESD circuit which can be applied to a high-resolution display panel.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an electrostatic discharge (ESD) circuit including a transistor structure having at least five thin film transistors (TFTs), said transistor structure configured in view of changes in operating characteristics that depend on a channel length of a back channel etched (BCE) type oxide transistor.

Said transistor structure may include at least three switching thin film transistors (TFTs), each being an oxide TFT of a BCE type with an active layer of oxide material; and at least two equalizer thin film transistors (TFTs), operatively connected with said switching TFTs, each equalizer TFT being an oxide TFT of a BCE type with an active layer of oxide material and having a sequence of two or more oxide TFTs being connected together in series to achieve an effective channel length that is greater than a channel length of a single oxide TFT.

Said equalizer TFTs may include a first equalizer TFT having one end connected to a first switching TFT and having its other end connected to a second switching TFT, and a second equalizer TFT having one end connected to said second switching TFT and having its other end connected to a third switching TFT.

Said sequence of two or more oxide TFTs may share one gate electrode.

All of said switching TFTs and said equalizer TFTs may be located in a non-active area of a display panel.

Each switching TFT and each oxide TFT in each equalizer TFT may have the same structure as oxide TFTs in an active area of said display panel due to the same manufacturing process thereof.

Each oxide TFT in each equalizer TFT may have the same channel length as oxide TFTs in said active area of said display panel.

Each oxide TFT in each equalizer TFT may have substantially the same operating characteristic as oxide TFTs in said active area of said display panel.

In an aspect of the present invention, there is provided an apparatus including: a display panel having an active area including an array of pixels and having a non-active area surrounding the active area, with each pixel connected to at least one among a plurality of data lines, connected to at least one among a plurality of gate lines, and including one or more oxide thin film transistors (TFTs) that employ oxide material as its active layer; and a plurality of electrostatic protection elements in the non-active area that inhibit electrostatic charges from flowing into the active area via the data lines or the gate lines, each electrostatic protection element including a plurality of oxide TFTs among which at least two oxide TFTs are center TFTs that respectively have an amalgamated structure with three of more individual oxide TFTs connected together in series to attain an elongated effective channel length.

The electrostatic protection elements may include: a first set of electrostatic protection circuits disposed at start portions and end portions of each of the gate lines and of each of the data lines; and a second set of electrostatic protection circuits disposed between a common voltage line and the first set of electrostatic protection circuits.

The second set of electrostatic protection circuits may include: a data protection circuit respectively disposed at each lower corner of the display panel, a first terminal thereof connected to the common voltage line and a second terminal thereof connected to ground, to protect the display panel from overvoltage currents.

The electrostatic protection elements including the plurality of oxide TFTs achieve a 5-TFT configuration may include: a first center TFT having one end connected to a first switching TFT and having its other end connected to a second switching TFT, and a second center TFT having one end connected to said second switching TFT and having its other end connected to a third switching TFT.

In an aspect of the present invention, there is provided a display device including: a pixel disposed in an active area of a display panel; and an electrostatic discharge (ESD) circuit disposed in a non-active area of the display panel, wherein, the ESD circuit comprises a first thin film transistor (TFT) configured to prevent a current from simultaneously flowing in two directions and a second TFT configured to divert an overvoltage current, and a channel length of the first TFT differs from a channel length of the second TFT.

The channel length of the first TFT may be equal to a channel length of a TFT disposed in the pixel, and the channel length of the second TFT may be longer than the channel length of the TFT disposed in the pixel.

A channel of the second TFT may include two or more channels which have the same length as a length of a channel of the TFT disposed in the pixel and are serially connected to each other.

The ESD circuit may include three first TFTs and two second TFTs, and each of the two second TFTs may be disposed between two first TFTs.

Each of the three first TFTs, the two second TFTs, and the TFT disposed in the pixel may be a back channel etched (BCE) type oxide TFT.

In addition, other features and effects of the present invention can be newly construed from the embodiments of the present invention.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 13 is a diagram illustrating a static current based on a channel length of a center TFT and a structure of an ESD circuit.

DETAILED DESCRIPTION OF THE INVENTION

Figure 1:
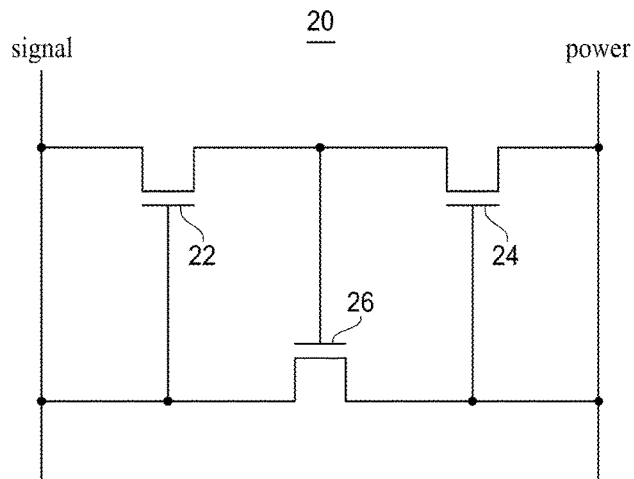
FIG. 1 is a diagram illustrating a ESD circuit.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after,' 'subsequent,' 'next,' and 'before,' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

The present invention relates to an ESD circuit and an LCD device including the same, which decrease a size of the ESD circuit and reduce a static current.

The present invention provides an ESD circuit and an LCD device including the same, which decrease a static current. Also, the present invention provides an ESD circuit and an LCD device including the same, which decrease consumption power. Also, the present invention provides an ESD circuit and an LCD device including the same, which decrease a circuit area and enhance electrostatic discharge performance. Also, the present invention provides an ESD circuit which can be applied to a high-resolution display panel.

FIG. 1 is a diagram illustrating a ESD circuit 20.

Referring to FIG. 1, the ESD circuit 20 includes two switching TFTs 22 and 24 and one equalizer TFT 26.

A first switching TFT 22 and a second switching TFT 24 operate as a diode because a gate is diode-connected to a source, and prevents a current from flowing in both directions.

In order to increase an operation speed, an oxide TFT in which a material of an active layer of each of the first switch TFT 22, the second switching TFT 24, and the equalizer TFT 26 is oxide is applied to the ESD circuit 20.

When each of the first switch TFT 22, the second switching TFT 24, and the equalizer TFT 26 is the oxide TFT, an operation speed based on an inflow of static electricity is fast, but an amount of static current is high, causing an increase in consumption power.

In order to solve a problem caused by the application of the oxide TFT to the ESD circuit 20, a static current is minimized by increasing the number of TFTs or enlarging a length of a channel (i.e., increasing a resistance of the channel).

However, since an area is limited in designing an ESD circuit, it is difficult to apply a method of increasing the number of TFTs or enlarging a length of a channel. Particularly, as a resolution becomes higher, there is a limitation in securing a circuit design area in a display panel, and for this reason, it is difficult to design an ESD circuit for sufficiently securing electrostatic discharge performance and minimizing a static current.

Figure 2:
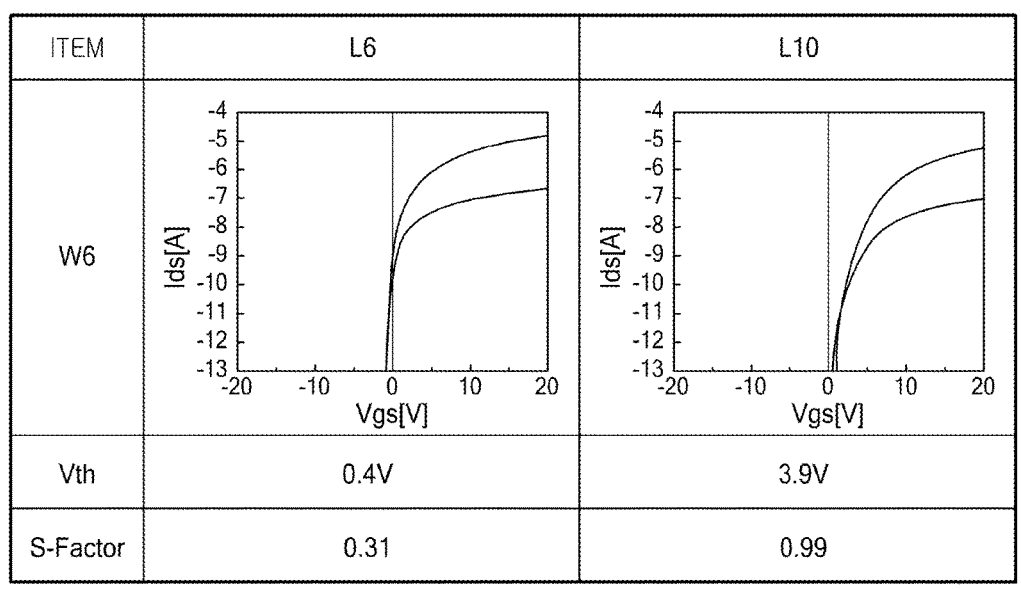
FIG. 2 is a diagram showing a change in voltage-current characteristic with respect to a channel length of a BCE-type oxide TFT.

FIG. 2 is a diagram showing a change in voltage-current characteristic with respect to a channel length of a back channel etched (BCE)-type oxide TFT.

Referring to FIG. 2, in the BCE-type oxide TFT, as a channel length increases, an initial threshold voltage (initial Vth) is positive-shifted, and an S-factor value increases. For this reason, it is very difficult to reflect a design of an ESD circuit, based on an a-Si TFT or an ES oxide TFT, in the BCE-type oxide TFT Here, the S-factor denotes the reciprocal of a slope of a sub-threshold area in a trans-curve graph of a TFT, and has an S-factor value from zero. As the S-factor value decreases, a characteristic of a device having a switching function is excellent. On the other hand, as the S-factor value increases, the characteristic of the device is degraded.

When a design of a TFT is changed to increase a length of a channel from 6 μm to 10 μm so as to decrease a static current of an ESD circuit including the BCE-type oxide TFT, the S-factor value increases, causing a change in an operating characteristic of an oxide TFT.

Therefore, it is required to develop the BCE-type oxide TFT for maintaining a static current at a level equal to a a-Si TFT and securing a high switching speed and electrostatic discharge performance at a level equal to an oxide TFT. Also, it is required to develop an ESD circuit including an oxide TFT that satisfies discharge performance and switching performance, and moreover, it is required to develop an LCD device including the ESD circuit.

Figure 3:
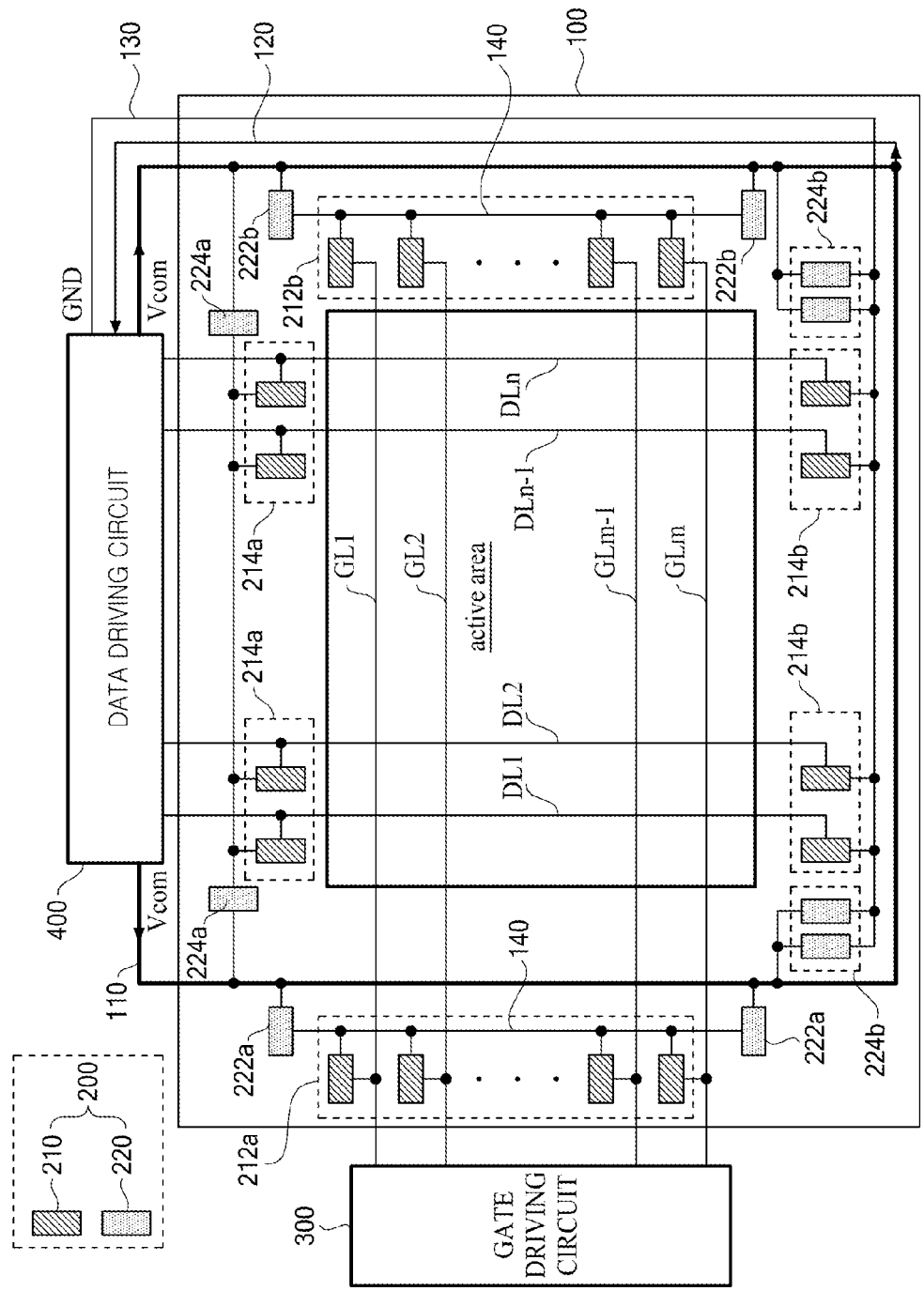
FIG. 3 is a diagram illustrating an LCD device according to an embodiment of the present invention.

FIG. 3 is a diagram illustrating an LCD device according to an embodiment of the present invention.

Referring to FIG. 3, the LCD device according to an embodiment of the present invention includes a liquid crystal panel 100 that displays an image according to an input image signal, a plurality of ESD circuits 200, a gate driving circuit 300, a data driving circuit 400, a controller (not shown) that controls operations of the gate driving circuit 300 and the data driving circuit 400, and a power supply (not shown) that supplies power to the driving circuits.

In the liquid crystal panel 100, m number of gate lines GL1 to GLm and n number of data lines DL1 to DLn are arranged to intersect each other. A plurality of pixels are arranged in a matrix type by intersections between the data lines and the gate lines. An oxide TFT is provided as a switching element in each of the pixels, and switches the supply of an image data in each pixel. Also, a storage capacitor Cst is provided in each pixel.

A common voltage line 110 that supplies a common voltage Vcom output from the data driving circuit 400 to the pixels, a common voltage feedback line 120 that feeds back the common voltage Vcom to the data driving circuit 400, a ground line 130 that supplies a ground voltage to the liquid crystal panel 100, and a common line 140 that connects the ESD circuits 200 are disposed in the liquid crystal panel 100.

The oxide TFT of each pixel is switching on by a gate driving signal supplied through a corresponding gate line, and when the oxide TFT is turned on, a data voltage supplied through a corresponding data line is supplied to a corresponding pixel. An alignment state of liquid crystal of each pixel is changed by an electric field difference between the data voltage and the common voltage, and a transmittance of light incident from a backlight unit is adjusted by adjusting an alignment of the liquid crystal, thereby displaying an image.

The controller aligns an input image signal to RGB image data in units of a frame, and supplies the aligned RGB image data to the data driving circuit 400. Also, the controller generates a gate control signal GCS for controlling the gate driving circuit 300 and a data control signal DCS for controlling the data driving circuit 400 by using an input timing signal TS. The timing signal TS includes a data enable signal DE, a horizontal sync signal Hsync, a vertical sync signal Vsync, and a clock signal CLK.

The gate control signal GCS may include a gate start pulse GSP, a gate shift clock GSC, and a gate output enable signal GOE.

The data control signal DCS may include a source start pulse SSP, a source sampling clock SSC, a source output enable signal SOE, and a polarity control signal POL.

The data driving circuit 400 converts RGB image data, supplied from the controller, into analog data voltages. Subsequently, the data driving circuit 400 respectively supplies the analog data voltages to the pixels through the data lines. Also, the data driving circuit 400 generates signals Vst, CLK, VDD and Vreset for driving the gate driving circuit 300 having a gate-in panel (GIP) type according to control by the controller, and supplies the generated signals Vst, CLK, VDD and Vreset to the gate driving circuit 300.

The gate driving circuit 300 supplies a gate driving signal Vout to the plurality of gate lines of the liquid crystal panel 100. The gate driving circuit 300 generates the gate driving signal Vout by using input driving voltages VDD and VSS and the signals Vst, CLK, VDD and Vreset, and sequentially supplies the gate driving signal Vout to the gate lines of the liquid crystal panel 100. The gate driving circuit 300 includes a plurality of stages corresponding to the plurality of gate lines. The plurality of stages may be divided into odd stages and even stages, and may be distributed and disposed at both sides of the liquid crystal panel 100.

When static electricity or an overvoltage is input to the liquid crystal panel 100, a pixel and a line are broken down, and for this reason, an image cannot normally be displayed. In order to prevent the static electricity or the overvoltage from being input to the liquid crystal panel 100, the plurality of ESD circuits 200 are disposed in the liquid crystal panel 100. The ESD circuits 200 limit the overvoltage input to the liquid crystal panel 100, and divert an overvoltage current, thereby protecting pixels and lines disposed in an active area.

When static electricity occurs, the ESD circuits 200 according to an embodiment of the present invention diverts an overvoltage current based on the static electricity to a ground GND terminal or a common voltage Vcom terminal.

The plurality of ESD circuits 200 include a plurality of first ESD circuits (main ESD circuits) 210 and a plurality of second ESD circuits (sub ESD circuits) 220. The plurality of first ESD circuits 210 and the plurality of second ESD circuits 220 include a plurality of TFTs. Each of the plurality of TFTs uses an oxide TFT of which an active layer is formed of an oxide semiconductor material having good switching characteristic. An operation of the liquid crystal panel 100 is not affected by voltage drop or a static current which occurs in the operation of the liquid crystal panel 100, and when an overvoltage based on static electricity occurs, each of the plurality of first ESD circuits 210 and the plurality of second ESD circuits 220 is quickly turned on at a low resistance.

The plurality of first ESD circuits 210 are disposed at start portions and end portions of the plurality of gate lines and the plurality of data lines. The plurality of second ESD circuits 220 are disposed between the common voltage line 110 and the plurality of first ESD circuits 210. An overvoltage current diverted through the plurality of first ESD circuits 210 is discharged to the common voltage Vcom terminal and the ground terminal through the plurality of second ESD circuits 220.

A Plurality of First ESD Circuits

The plurality of first ESD circuits 210 include a plurality of gate ESD circuits 212a and 212b and a plurality of data ESD circuits 214a and 214b.

The plurality of gate ESD circuits 212a and 212b include a plurality of first gate ESD circuits 212a and a plurality of second gate ESD circuits 212b.

The first gate ESD circuits 212a are disposed at start portions of the gate lines. A first terminal of each of the first gate ESD circuits 212a is connected to a corresponding gate line, and a second terminal is connected to the common line 140.

The second gate ESD circuits 212b are disposed at end portions of the gate lines. A first terminal of each of the second gate ESD circuits 212b is connected to a corresponding gate line, and a second terminal is connected to the common line 140.

The first gate ESD circuit 212a is connected to a start portion of one gate line GL, and the second gate ESD circuit 212b is connected to an end portion of the one gate line GL. Therefore, the one gate line GL is protected by two ESD circuits.

The plurality of data ESD circuits 214a and 214b include a plurality of first data ESD circuits 214a and a plurality of second data ESD circuits 214b.

The first data ESD circuits 214a are disposed at start portions of the data lines. A first terminal of each of the first data ESD circuits 214a is connected to a corresponding data line, and a second terminal is connected to the common voltage line 110.

The second data ESD circuits 214b are disposed at end portions of the data lines. A first terminal of each of the second data ESD circuits 214b is connected to a corresponding data line, and a second terminal is connected to the ground line 130.

The first data ESD circuit 214a is connected to a start portion of one data line DL, and the second data ESD circuit 214b is connected to an end portion of the one data line DL. Therefore, the one data line DL is protected by two ESD circuits.

A Plurality of Second ESD Circuits

The plurality of second ESD circuits 220 include a plurality of first protection circuits 222a and 222b and a plurality of second protection circuits 224a and 224b.

Here, each of the plurality of first protection circuits 222a and 222b is an ESD circuit that discharges an overvoltage current, diverted through the plurality of gate ESD circuits 212a and 212b, to the common voltage Vcom terminal and the ground GND terminal.

Each of the plurality of second protection circuits 224a and 224b is an ESD circuit that discharges an overvoltage current, diverted through the plurality of data ESD circuits 214a and 214b, to the common voltage Vcom terminal and the ground GND terminal.

The plurality of first protection circuits 222a and 222b include a plurality of first gate protection circuits 222a and a plurality of second gate protection circuits 222b.

First, the plurality of first protection circuits 222a and 222b will be described in detail.

The first gate protection circuits 222a are disposed between the common voltage line 110 and the first gate ESD circuits 212a. A first terminal of each of the first gate protection circuits 222a is connected to the common line 140 connected to the first gate ESD circuits 212a. A second terminal of each of the first gate protection circuits 222a is connected to the common voltage line 110.

The first gate protection circuits 222a may be configured with two ESD circuits. One ESD circuit is disposed between start portions of the first gate ESD circuits 212a and the common voltage line 110, and the other one ESD circuit is disposed between end portions of the first gate ESD circuits 212a and the common voltage line 110. That is, one ESD circuit of the first gate protection circuits 222a is disposed at a left upper end of the liquid crystal panel, and protects the liquid crystal panel from an overvoltage current. The other one ESD circuit is disposed at a left lower end of the liquid crystal panel, and protects the liquid crystal panel from an overvoltage current.

The second gate protection circuits 222b are disposed between the common voltage line 110 and the second gate ESD circuits 212b. A first terminal of each of the second gate protection circuits 222b is connected to the common line 140. The second gate ESD circuits 212b are connected to the common line 140. A second terminal of each of the second gate protection circuits 222b is connected to the common voltage line 110.

The second gate protection circuits 222b may be configured with two ESD circuits. One ESD circuit is disposed between start portions of the second gate ESD circuits 212b and the common voltage line 110, and the other one ESD circuit is disposed between end portions of the second gate ESD circuits 212b and the common voltage line 110. That is, one ESD circuit of the second gate protection circuits 222b is disposed at a right upper end of the liquid crystal panel, and protects the liquid crystal panel from an overvoltage current. The other one ESD circuit is disposed at a right lower end of the liquid crystal panel, and protects the liquid crystal panel from an overvoltage current.

Next, the plurality of second protections 224a and 224b will be described in detail.

The plurality of first protection circuits 222a and 222b include a plurality of first data protection circuits 224a and a plurality of second data protection circuits 224b.

The first data protection circuits 224a are disposed between the common voltage line 110 and the first data ESD circuits 214a. A first terminal of each of the first data protection circuits 224a is connected to the first data ESD circuits 214a. A second terminal of each of the first data protection circuits 224a is connected to the common voltage line 110.

The first data protection circuits 224a may be configured with two ESD circuits. One ESD circuit is disposed between start portions of the first data ESD circuits 214a and the common voltage line 110, and the other one ESD circuit is disposed between end portions of the first data ESD circuits 214a and the common voltage line 110. That is, one ESD circuit of the first data protection circuits 224a is disposed at a left upper end of the liquid crystal panel, and protects the liquid crystal panel from an overvoltage current. The other one ESD circuit is disposed at a right upper end of the liquid crystal panel, and protects the liquid crystal panel from an overvoltage current.

The second data protection circuits 224b are disposed between the common voltage line 110 and the second data ESD circuits 214b. A first terminal of each of the second data protection circuits 224b is connected to the second data ESD circuits 214b. A second terminal of each of the second data protection circuits 224b is connected to the ground line 130.

The second data protection circuits 224b may be configured with four ESD circuits. Two ESD circuits each are connected in a parallel structure, and are disposed between start portions of the second data ESD circuits 214b and the common voltage line 110, and the other two ESD circuits are disposed between end portions of the second data ESD circuits 214b and the common voltage line 110. That is, two ESD circuits of the second data protection circuits 224b are disposed at a left lower end of the liquid crystal panel, and protect the liquid crystal panel from an overvoltage current. The other two ESD circuits are disposed at a right lower end of the liquid crystal panel, and protect the liquid crystal panel from an overvoltage current.

The liquid crystal panel has been manufactured, and then, when a signal test is performed, an overvoltage current can be input to the liquid crystal panel. However, since the second data protection circuits 224b are configured in a structure where two ESD circuits are connected in a parallel structure, the overvoltage current can be efficiently discharged.

Figure 4:
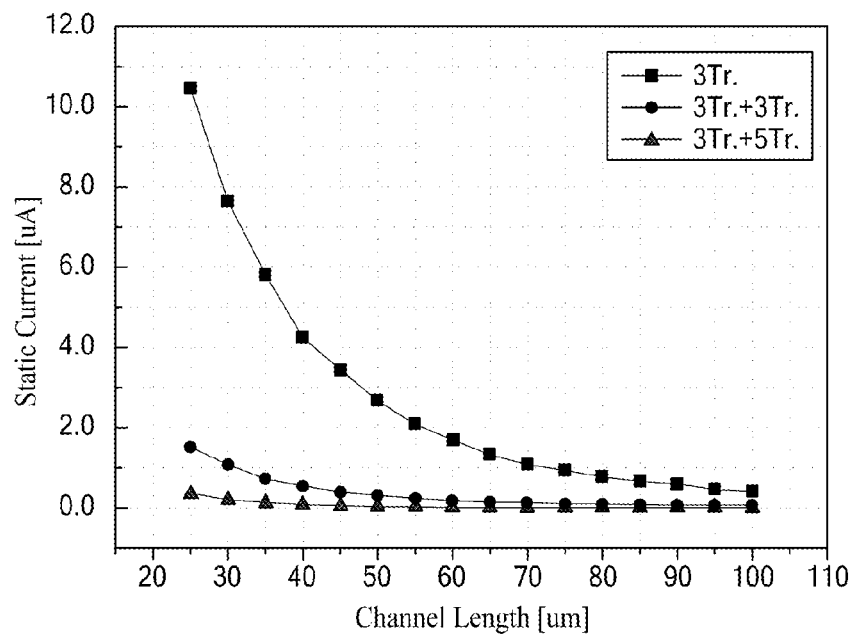
FIG. 4 is a diagram illustrating a static current based on an increase in a channel length of an oxide TFT included in an ESD circuit.

FIG. 4 is a diagram illustrating a static current based on an increase in a channel length of an oxide TFT included in an ESD circuit.

Referring to FIG. 4, in an oxide TFT, a static current of an ESD circuit increases depending on mobility characteristic. Also, a driving error and consumption power of the liquid crystal panel increase due to a static current of the oxide TFT.

When an ESD circuit is configured in a 3TFT+3TFT structure or a 3TFT+5TFT structure by increasing the number of TFTs configuring an ESD circuit, a static current can be reduced. Therefore, a problem caused by the application of the oxide TFT to the ESD circuit can be solved.

In another method, when a channel length of a TFT increases, a static current is reduced, and thus, a problem caused by the application of the oxide TFT to the ESD circuit can be solved.

However, when the number of TFTs configuring the ESD circuit or a channel length of each TFT increases, an area of the ESD circuit increases on a substrate, and for this reason, it is difficult to design a circuit.

An oxide TFT disposed in the active area of the liquid crystal panel and an oxide TFT of an ESD circuit disposed in a non-display area are formed in the same manufacturing process, and thus, the manufacturing cost decreases, and the manufacturing efficiency increases. For example, when a channel length of the oxide TFT in the active area is maintained as-is, and only a channel length of the oxide TFT of the ESD circuit is separately designed, the oxide TFT in the active area and the oxide TFT of the ESD circuit cannot be formed in the same manufacturing process, and for this reason, the manufacturing cost and the manufacturing efficiency decrease, whereby the application of the manufacturing method is limited. That is, in a case where channel lengths are differently formed since a process of manufacturing the oxide TFT in the active area and a process of manufacturing the oxide TFT of the ESD circuit have different conditions, it is difficult to apply the case to an actual manufacturing process.

According to the present embodiment, in configuring an ESD circuit with a BCE-type oxide TFT, a channel length of the oxide TFT of the ESD circuit is applied identically to a channel length of the oxide TFT in the active area. Here, an ESD circuit is provided so that a plurality of oxide TFTs are connected in series.

Therefore, the oxide TFT in the active area and the oxide TFT of the ESD circuit are formed in the same manufacturing process, and a static current of an ESD circuit is reduced, thereby decreasing consumption power.

Figure 5:
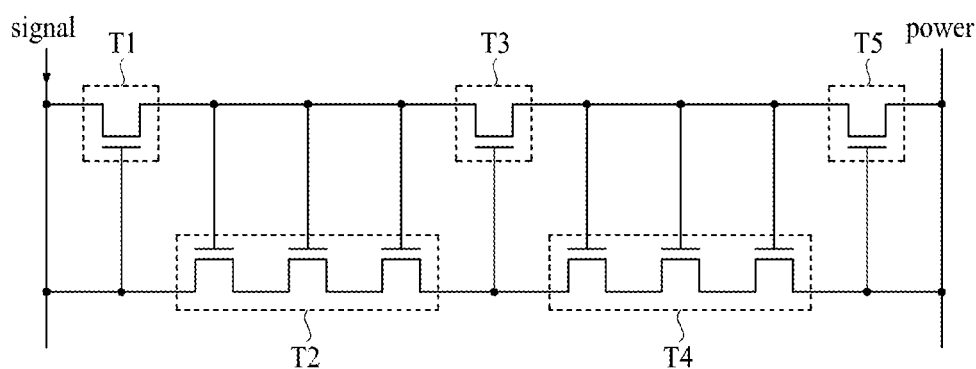
FIG. 5 is a diagram illustrating an equivalent circuit of an ESD circuit according to a first embodiment of the present invention.

FIG. 5 is a diagram illustrating an equivalent circuit of an ESD circuit according to a first embodiment of the present invention.

Referring to FIG. 5, in the ESD circuit according to the first embodiment of the present invention, a channel length of one oxide TFT is equal to that of an oxide TFT in an active area. However, a channel length of an oxide TFT configuring the ESD circuit increases by reflecting a structure, where a plurality of oxide TFTs are connected in series, in a design. Therefore, an ESD circuit for decreasing a static current has been developed.

For example, as illustrated in FIG. 5, the ESD circuit may be provided in a 5TFT structure. Here, three switching TFTs (i.e., a first switching TFT T1, a second switching TFT T3, and a third switching TFT T5) are configured with one oxide TFT having the same channel length as that of the oxide TFT disposed in the active area.

Furthermore, two center TFTs (i.e., a first center TFT T2 and a second center TFT T4) are configured in a structure where three oxide TFTs having the same channel length as that of the oxide TFT disposed in the active area are connected in series.

Here, the first center TFT T2 is disposed between the first switching TFT T1 and the second switching TFT T3, and the second center TFT T4 is disposed between the second switching TFT T3 and the third switching TFT T5.

When the channel length of the oxide TFT in the active area (a display area) is 8 μm, a channel length of each of the first and second center TFTs T2 and T4 in a non-display area is 24 μm (3×8 μm). Also, in addition to the channel length of the oxide TFT in the active area (the display area) and the channel length of each of a plurality of oxide TFTs configuring an ESD circuit disposed in the non-display area, a width of a channel may also be formed identically.

An example where a channel length of an oxide TFT is 8 μm has been described above with reference to FIG. 5, but corresponds to one of various embodiments of the present invention. The channel length of the oxide TFT may be formed shorter than 8 μm, or may be formed longer than 8 μm.

As described above, when a channel length of each of the first and second center TFTs T2 and T4 is enlarged, a resistance of a channel increases in proportion to the enlarged channel length, and thus, a static current and consumption power decrease.

Figure 6:
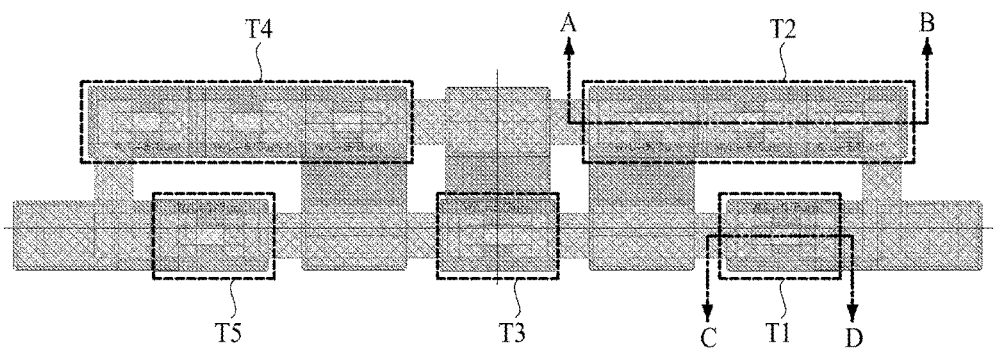
FIG. 6 is a diagram illustrating a layout of an ESD circuit according to a first embodiment of the present invention.
Figure 7:
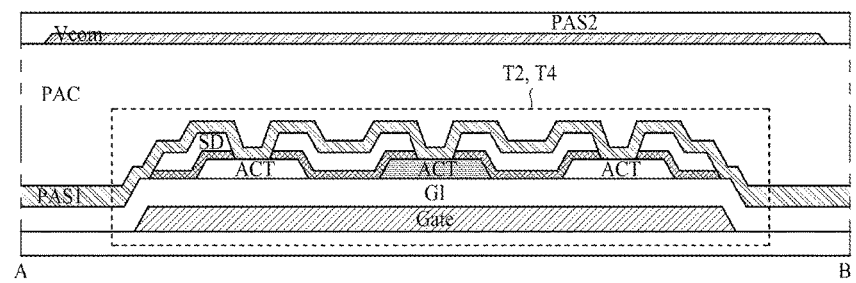
FIG. 7 is a cross-sectional view of an ESD circuit according to a first embodiment of the present invention.
Figure 7:
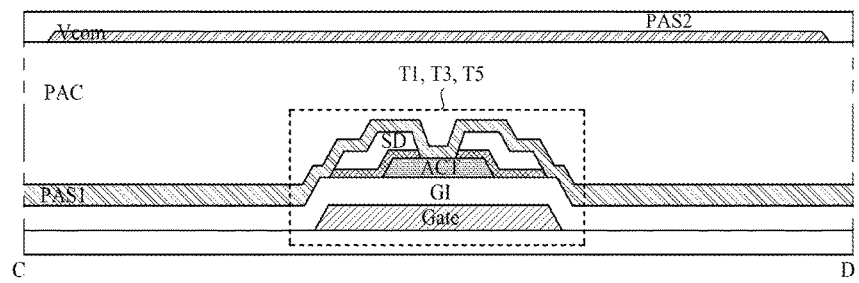

FIG. 6 is a diagram illustrating a layout of an ESD circuit according to a first embodiment of the present invention, and FIG. 7 is a cross-sectional view of an ESD circuit according to a first embodiment of the present invention. A cross-sectional surface of a center TFT taken along line A-B of FIG. 6 and a cross-sectional surface of a switching TFT taken along line C-D of FIG. 6 are illustrated in FIG. 7.

Referring to FIGS. 6 and 7, a 5TFT structure may be applied in designing a layout of an ESD circuit. That is, one ESD circuit may be provided in the 5TFT structure.

The first center TFT T2 and the second center TFT T4 are disposed in a structure where three oxide TFTs having the same channel length as that of the oxide TFT disposed in the active area (the display area) are connected in series. The first switching TFT T1, the second switching TFT T3, and the third switching TFT T5 are configured with one oxide TFT having the same channel length as that of the oxide TFT disposed in the active area.

A structure of the first center TFT T2 and second center TFT T4 of an ESD circuit having the 5TFT structure will be described below.

As illustrated in FIG. 7, a gate electrode is disposed on a substrate, and a gate insulator GI is formed to cover the gate electrode. Three active layers ACT are disposed on the gate insulator GI to overlap the gate electrode and are separated from each other at certain intervals. In this case, an oxide semiconductor material is applied to the active layers ACT.

A source electrode/drain electrode is disposed on each of the three active layers ACT. One center TFT is configured with one gate, three active layers, and three source electrodes/drain electrodes, and has a structure in which three oxide TFTs are connected in series.

A first passivation layer PAS1 is disposed to cover the source electrode/drain electrode, and a planarizing layer is formed of photo acryl (PAC) for removing a step height caused by a profile of a TFT. A common electrode Vcom is disposed on the planarizing layer, and a second passivation layer PAS2 is disposed to cover the common electrode Vcom.

Except that the active layer ACT is formed as one, a structure of each of the first to third switching TFTs T1, T3 and T5 is the same as that of each of the first and second center TFTs T2 and T4, and thus, a detailed description is not provided.

The ESD circuit having the above-described 5TFT structure may be applied to the plurality of first ESD circuits 210 and the plurality of second ESD circuits 220 described above with reference to FIG. 3.

The ESD circuit having the 5TFT structure according to an embodiment of the present invention is designed so that each oxide TFT has the same channel length as that of the oxide TFT disposed in the active area, and thus, it is not required to separately change a channel design for the ESD circuit.

Moreover, in the ESD circuit having the 5TFT structure according to an embodiment of the present invention, an area of a design can be reduced on a substrate in comparison with the relate art in which a channel length of one oxide TFT is formed as a large length, and thus, designing the ESD circuit is not restricted.

In the ESD circuit including the oxide TFT having the 5TFT structure according to an embodiment of the present invention, a static current and consumption power can be reduced to a level equal to an ESD circuit including three a-Si TFTs. Also, the ESD circuit including the oxide TFT having the 5TFT structure according to an embodiment of the present invention may be applied to a high-resolution display panel.

Figure 8:
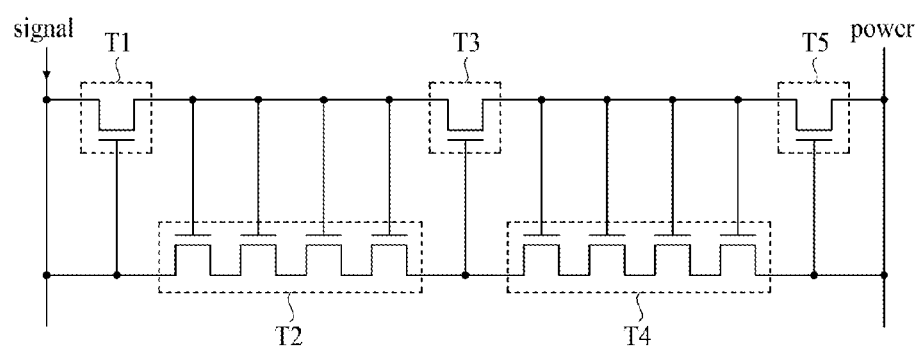
FIG. 8 is an equivalent circuit diagram of an ESD circuit according to a second embodiment of the present invention.

FIG. 8 is an equivalent circuit diagram of an ESD circuit according to a second embodiment of the present invention.

Referring to FIG. 8, an ESD circuit may be provided in a 5TFT structure. Here, three switching TFTs (i.e., a first switching TFT T1, a second switching TFT T3, and a third switching TFT T5) are configured with one oxide TFT having the same channel length as that of an oxide TFT disposed in an active area.

Furthermore, two center TFTs (i.e., a first center TFT T2 and a second center TFT T4) are configured in a structure where four oxide TFTs having the same channel length as that of the oxide TFT disposed in the active area (a display area) are connected in series.

When the channel length of the oxide TFT in the active area (the display area) is 8 μm, a channel length of each of the first and second center TFTs T2 and T4 in a non-display area is 32 μm (4×8 μm). Also, in addition to the channel length of the oxide TFT in the active area (the display area)

and the channel length of each of a plurality of oxide TFTs configuring an ESD circuit, a width of a channel may also be formed identically.

An example where a channel length of an oxide TFT is 8 μm has been described above with reference to FIG. 8, but corresponds to one of various embodiments of the present invention. The channel length of the oxide TFT may be formed shorter than 8 μm, or may be formed longer than 8 μm.

As described above, when a channel length of each of the first and second center TFTs T2 and T4 is enlarged, a resistance of a channel increases in proportion to the enlarged channel length, and thus, a static current and consumption power decrease.

Figure 9:
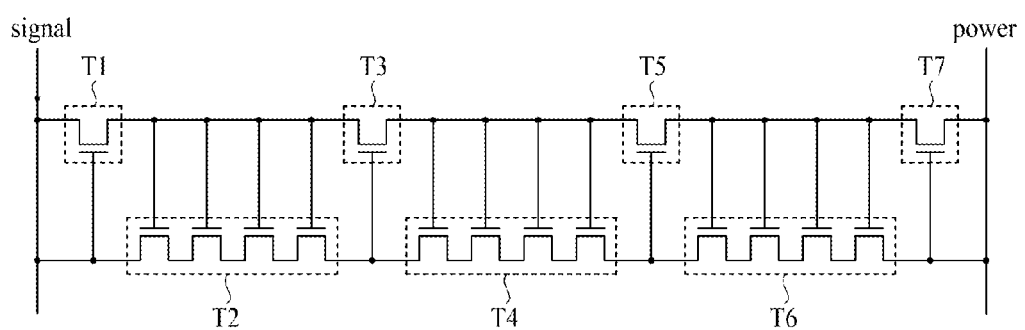
FIG. 9 is an equivalent circuit diagram of an ESD circuit according to a third embodiment of the present invention.

FIG. 9 is an equivalent circuit diagram of an ESD circuit according to a third embodiment of the present invention. Referring to FIG. 9, a whole length of a channel of an oxide TFT configuring the ESD circuit according to the third embodiment of the present invention is longer than a channel length of an oxide TFT disposed in an active area (a display area). In the oxide TFT of the ESD circuit, a plurality of sub-channels (or short channels) are serially connected to each other to configure one channel. Here, a length of each of the plurality of sub-channels of the oxide TFT is equal to the channel length of the oxide TFT disposed in the active area (the display area).

As described above, in the ESD circuit according to the third embodiment of the present invention, since a plurality of sub-channels are serially connected to each other to configure one channel, a whole length of a channel of an oxide TFT can increase. Accordingly, provided is an ESD circuit for decreasing the amount of leaked current.

The ESD circuit may be disposed in a 7TFT structure.

Four switching TFTs (i.e., a first switching TFT T1, a second switching TFT T3, a third switching TFT T5, and a fourth switching TFT T7) are configured with one oxide TFT having the same channel length as that of the oxide TFT disposed in the active area (the display area). Furthermore, three center TFTs (i.e., a first center TFT T2, a second center TFT T4, and a third center TFT T6) are configured in a structure where three oxide TFTs having the same channel length as that of the oxide TFT disposed in the active area (the display area) are connected in series.

When the channel length of the oxide TFT in the active area (the display area) is 8 μm, a channel length of each of the first to third center TFTs T2, T4 and T6 in a non-display area is 24 μm (3×8 μm). Also, in addition to the channel length of the oxide TFT in the active area (the display area) and the channel length of each of a plurality of oxide TFTs configuring an ESD circuit disposed in the non-display area, a width of a channel may also be formed identically.

An example where a channel length of an oxide TFT is 8 μm has been described above with reference to FIG. 9, but corresponds to one of various embodiments of the present invention. The channel length of the oxide TFT may be formed shorter than 8 μm, or may be formed longer than 8 μm.

As described above, when a channel length of each of the first to third center TFTs T2, T4 and T6 is enlarged, a resistance of a channel increases in proportion to the enlarged channel length, and thus, a static current and consumption power decrease.

The TFT structure illustrated in FIG. 9 may be applied in designing a layout of an ESD circuit. In this case, similarly to the oxide TFT in the active area (the display area), the first to third center TFTs T2, T4 and T6 are disposed in a structure where four oxide TFTs having a short channel are connected in series.

Moreover, the first switching TFT T1, the second switching TFT T3, the third switching TFT T5, and the fourth switching TFT T7 are formed of one oxide TFT having the same channel length as that of the oxide TFT disposed in the active area (the display area).

The ESD circuit having the above-described 7TFT structure may be applied to the plurality of first ESD circuits 210 and the plurality of second ESD circuits 220 described above with reference to FIG. 3.

The ESD circuit having the 7TFT structure according to an embodiment of the present invention is designed so that each oxide TFT has the same channel length as that of the oxide TFT disposed in the active area (the display area), and thus, it is not required to separately change a channel design for the ESD circuit.

Moreover, in the ESD circuit having the 7TFT structure according to an embodiment of the present invention, an area of a substrate occupied by the ESD circuit can be reduced in comparison with the relate art in which a channel length of one oxide TFT is formed as a large length, and thus, the ESD circuit can be freely designed.

In the ESD circuit including the oxide TFT having the 7TFT structure according to an embodiment of the present invention, a static current and consumption power can be reduced to a level equal to an ESD circuit including three a-Si TFTs. Also, the ESD circuit including the oxide TFT having the 5TFT structure according to an embodiment of the present invention may be applied to a high-resolution display panel.

Figure 10:
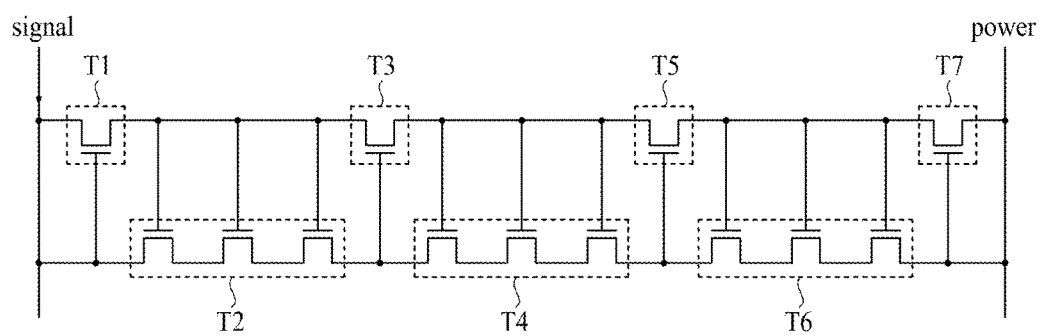
FIG. 10 is an equivalent circuit diagram of an ESD circuit according to a fourth embodiment of the present invention.

FIG. 10 is an equivalent circuit diagram of an ESD circuit according to a fourth embodiment of the present invention.

Referring to FIG. 10, a whole length of a channel of an oxide TFT configuring the ESD circuit according to the fourth embodiment of the present invention is longer than a channel length of an oxide TFT disposed in an active area (a display area). In the oxide TFT of the ESD circuit, a plurality of sub-channels (or short channels) are serially connected to each other to configure one channel. Here, a length of each of the plurality of sub-channels of the oxide TFT is equal to the channel length of the oxide TFT disposed in the active area (the display area).

As described above, in the ESD circuit according to the third embodiment of the present invention, since a plurality of sub-channels are serially connected to each other to configure one channel, a whole length of a channel of an oxide TFT can increase. Accordingly, provided is an ESD circuit for decreasing the amount of leaked current.

The ESD circuit may be disposed in a 7TFT structure. Here, four switching TFTs (i.e., a first switching TFT T1, a second switching TFT T3, a third switching TFT T5, and a fourth switching TFT T7) are configured with one oxide TFT having the same channel length as that of the oxide TFT disposed in the active area (the display area).

Furthermore, three center TFTs (i.e., a first center TFT T2, a second center TFT T4, and a third center TFT T6) are configured in a structure where four oxide TFTs having the same channel length as that of the oxide TFT disposed in the active area (the display area) are connected in series.

The first center TFT T2 is disposed between the first switching TFT T1 and the second switching TFT T3, the second center TFT T4 is disposed between the second switching TFT T3 and the third switching TFT T5, and the third center TFT T6 is disposed between the third switching TFT T5 and the fourth switching TFT T7.

When the channel length of the oxide TFT in the active area (the display area) is 8 µm, a channel length of each of the first to third center TFTs T2, T4 and T6 in a non-display area is 32 µm (4×8 µm). Also, in addition to the channel length of the oxide TFT in the active area (the display area) and the channel length of each of a plurality of oxide TFTs configuring an ESD circuit disposed in the non-display area, a width of a channel may also be formed identically.

An example where a channel length of an oxide TFT is 8 µm has been described above with reference to FIG. 10, but corresponds to one of various embodiments of the present invention. The channel length of the oxide TFT may be formed shorter than 8 µm, or may be formed longer than 8 µm.

As described above, when a channel length of each of the first to third center TFTs T2, T4 and T6 is enlarged, a resistance of a channel increases in proportion to the enlarged channel length, and thus, a static current and consumption power decrease.

Figure 11:
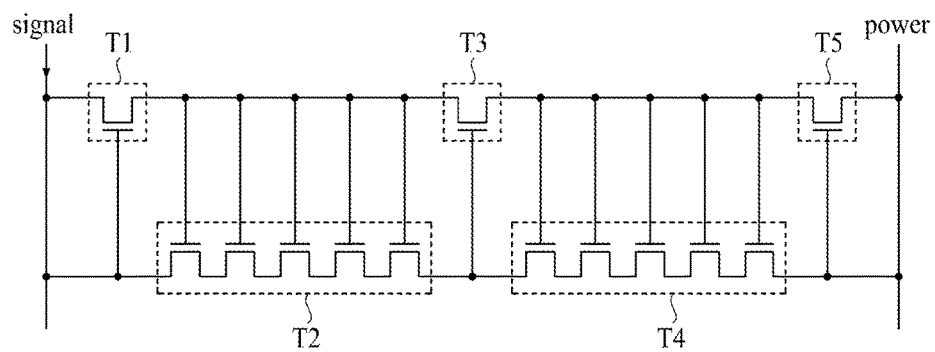
FIG. 11 is an equivalent circuit diagram of an ESD circuit according to a fifth embodiment of the present invention.

FIG. 11 is an equivalent circuit diagram of an ESD circuit according to a fifth embodiment of the present invention.

Referring to FIG. 11, an ESD circuit may be provided in a 5TFT structure. Here, three switching TFTs (i.e., a first switching TFT T1, a second switching TFT T3, and a third switching TFT T5) are configured with one oxide TFT having the same channel length as that of an oxide TFT disposed in an active area.

Furthermore, two center TFTs (i.e., a first center TFT T2 and a second center TFT T4) are configured in a structure where five oxide TFTs having the same channel length as that of the oxide TFT disposed in the active area (a display area) are connected in series.

When the channel length of the oxide TFT in the active area (the display area) is 8 µm, a channel length of each of the first and second center TFTs T2 and T4 in a non-display area is 40 µm (5×8 µm). Also, in addition to the channel length of the oxide TFT in the active area (the display area) and the channel length of each of a plurality of oxide TFTs configuring an ESD circuit, a width of a channel may also be formed identically.

An example where a channel length of an oxide TFT is 8 µm has been described above with reference to FIG. 11, but corresponds to one of various embodiments of the present invention. The channel length of the oxide TFT may be formed shorter than 8 µm, or may be formed longer than 8 µm.

As described above, when a channel length of each of the first and second center TFTs T2 and T4 is enlarged, a resistance of a channel increases in proportion to the enlarged channel length, and thus, a static current and consumption power decrease.

Figure 12:
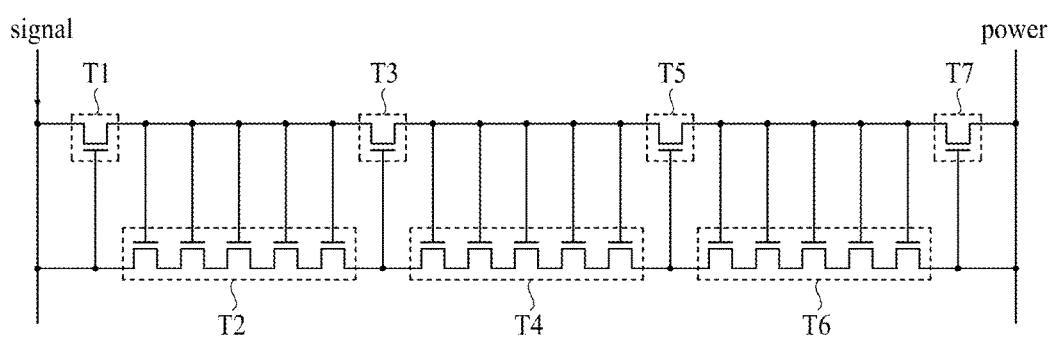
FIG. 12 is an equivalent circuit diagram of an ESD circuit according to a sixth embodiment of the present invention.

FIG. 12 is an equivalent circuit diagram of an ESD circuit according to a sixth embodiment of the present invention.

Referring to FIG. 12, the ESD circuit may be disposed in a 7TFT structure. Here, four switching TFTs (i.e., a first switching TFT T1, a second switching TFT T3, a third switching TFT T5, and a fourth switching TFT T7) are configured with one oxide TFT having the same channel length as that of the oxide TFT disposed in an active area (a display area).

Furthermore, three center TFTs (i.e., a first center TFT T2, a second center TFT T4, and a third center TFT T6) are configured in a structure where five oxide TFTs having the same channel length as that of the oxide TFT disposed in the active area (the display area) are connected in series.

When the channel length of the oxide TFT in the active area (the display area) is 8 µm, a channel length of each of the first to third center TFTs T2, T4 and T6 in a non-display area is 40 µm (5×8 µm). Also, in addition to the channel length of the oxide TFT in the active area (the display area) and the channel length of each of a plurality of oxide TFTs configuring an ESD circuit disposed in the non-display area, a width of a channel may also be formed identically.

An example where a channel length of an oxide TFT is 8 µm has been described above with reference to FIG. 12, but corresponds to one of various embodiments of the present invention. The channel length of the oxide TFT may be formed shorter than 8 µm, or may be formed longer than 8 µm.

As described above, when a channel length of each of the first to third center TFTs T2, T4 and T6 is enlarged, a resistance of a channel increases in proportion to the enlarged channel length, and thus, a static current and consumption power decrease.

FIG. 13 is a diagram illustrating a static current based on a channel length of a center TFT and a structure of an ESD circuit.

A static current based on a channel length of a center TFT and consumption power of a driving circuit will be described below with reference to FIG. 13.

For example, the ESD circuit having the 5TFT structure may be applied as the plurality of first ESD circuits 210 illustrated in FIG. 3. In this case, a channel length of each of the first and second center TFTs T2 and T4 of the ESD circuit having the 5TFT structure may be formed as 24 µm (3×8 µm).

When the channel length of each of the first and second center TFTs T2 and T4 of the ESD circuit having the 5TFT structure may be formed as 24 µm (3×8 µm), a size of each of the plurality of first ESD circuits 210 may be 294.5 µm.

Furthermore, the ESD circuit having the 7TFT structure may be applied as the plurality of second ESD circuits 220 illustrated in FIG. 3. In this case, a channel length of each of the first to third center TFTs T2, T4 and T6 of the ESD circuit having the 7TFT structure may be formed as 32 µm (4×8 µm).

When the channel length of each of the first to third center TFTs T2, T4 and T6 of the ESD circuit having the 7TFT structure may be formed as 32 µm (4×8 µm), a size of each of the plurality of second ESD circuits 220 may be 490.5 µm.

When the channel length of each of the first and second center TFTs T2 and T4 of the plurality of first ESD circuits 210 having the 5TFT structure is formed as 24 µm (3×8 µm), and a channel length of each of the first to third center TFTs T2, T4 and T6 of the plurality of second ESD circuits 220 having the 7TFT structure is formed as 32 µm (4×8 µm), a static current in an off state and an on state of the driving circuit can be reduced.

In addition to the structure of the ESD circuit according to the first to sixth embodiments, an ESD circuit in which a channel length of a center TFT is 8 µm or 16 µm may be configured.

As described above, when the first ESD circuits 210 and the second ESD circuits 220 are provided, a static current can be reduced to a level lower than an ESD circuit configured with three a-Si TFTs. Therefore, consumption power when the gate driving circuit is in an off state can be reduced to 0.021 mW.

As another example, the ESD circuit having the 5TFT structure may be applied as the plurality of first ESD circuits 210 illustrated in FIG. 3. In this case, a channel length of each of the first and second center TFTs T2 and T4 of the ESD circuit having the 5TFT structure may be formed as 24 μm (3×8 μm).

When the channel length of each of the first and second center TFTs T2 and T4 of the ESD circuit having the 5TFT structure may be formed as 24 μm (3×8 μm), a size of each of the plurality of first ESD circuits 210 may be 294.5 μm.

Furthermore, the ESD circuit having the 7TFT structure may be applied as the plurality of second ESD circuits 220 illustrated in FIG. 3. In this case, a channel length of each of the first to third center TFTs T2, T4 and T6 of the ESD circuit having the 7TFT structure may be formed as 40 μm (5×8 μm).

When the channel length of each of the first to third center TFTs T2, T4 and T6 of the ESD circuit having the 7TFT structure may be formed as 40 μm (5×8 μm), a size of each of the plurality of second ESD circuits 220 may be 562.5 μm.

When the channel length of each of the first and second center TFTs T2 and T4 of the plurality of first ESD circuits 210 having the 5TFT structure is formed as 24 μm (3×8 μm), and a channel length of each of the first to third center TFTs T2, T4 and T6 of the plurality of second ESD circuits 220 having the 7TFT structure is formed as 40 μm (5×8 nm), a static current in an off state and an on state of the driving circuit can be reduced as shown in FIG. 13.

As described above, when the first ESD circuits 210 and the second ESD circuits 220 are provided, a static current can be reduced to a level lower than an ESD circuit configured with three a-Si TFTs. Therefore, as shown in FIG. 13, consumption power when the gate driving circuit is in an off state can be reduced to 0.015 mW.

As another example, the ESD circuit having the 5TFT structure may be applied as the plurality of first ESD circuits 210 illustrated in FIG. 3. In this case, a channel length of each of the first and second center TFTs T2 and T4 of the ESD circuit having the 5TFT structure may be formed as 32 μm (4×8 μm).

When the channel length of each of the first and second center TFTs T2 and T4 of the ESD circuit having the 5TFT structure may be formed as 32 μm (4×8 μm), a size of each of the plurality of first ESD circuits 210 may be 342.5 μm.

Furthermore, the ESD circuit having the 7TFT structure may be applied as the plurality of second ESD circuits 220 illustrated in FIG. 3. In this case, a channel length of each of the first to third center TFTs T2, T4 and T6 of the ESD circuit having the 7TFT structure may be formed as 32 μm (4×8 μm).

When the channel length of each of the first to third center TFTs T2, T4 and T6 of the ESD circuit having the 7TFT structure may be formed as 32 μm (4×8 μm), a size of each of the plurality of second ESD circuits 220 may be 490.5 μm.

When the channel length of each of the first and second center TFTs T2 and T4 of the plurality of first ESD circuits 210 having the 5TFT structure is formed as 32 μm (4×8 μm), and a channel length of each of the first to third center TFTs T2, T4 and T6 of the plurality of second ESD circuits 220 having the 7TFT structure is formed as 32 μm (4×8 μm), a static current in an off state and an on state of the driving circuit can be reduced.

As described above, when the first ESD circuits 210 and the second ESD circuits 220 are provided, a static current can be reduced to a level lower than an ESD circuit configured with three a-Si TFTs. Therefore, as shown in FIG. 13, consumption power when the gate driving circuit is in an off state can be reduced to 0.018 mW.

As another example, the ESD circuit having the 5TFT structure may be applied as the plurality of first ESD circuits 210 illustrated in FIG. 3. In this case, a channel length of each of the first and second center TFTs T2 and T4 of the ESD circuit having the 5TFT structure may be formed as 32 μm (4×8 μm).

When the channel length of each of the first and second center TFTs T2 and T4 of the ESD circuit having the 5TFT structure may be formed as 32 μm (4×8 μm), a size of each of the plurality of first ESD circuits 210 may be 342.5 μm.

Furthermore, the ESD circuit having the 7TFT structure may be applied as the plurality of second ESD circuits 220 illustrated in FIG. 3. In this case, a channel length of each of the first to third center TFTs T2, T4 and T6 of the ESD circuit having the 7TFT structure may be formed as 40 μm (5×8 μm).

When the channel length of each of the first to third center TFTs T2, T4 and T6 of the ESD circuit having the 7TFT structure may be formed as 40 μm (5×8 μm), a size of each of the plurality of second ESD circuits 220 may be 562.5 μm.

When the channel length of each of the first and second center TFTs T2 and T4 of the plurality of first ESD circuits 210 having the 5TFT structure is formed as 32 μm (4×8 μm), and a channel length of each of the first to third center TFTs T2, T4 and T6 of the plurality of second ESD circuits 220 having the 7TFT structure is formed as 40 μm (5×8 μm), a static current in an off state and an on state of the driving circuit can be reduced.

As described above, when the first ESD circuits 210 and the second ESD circuits 220 are provided, a static current can be reduced to a level lower than an ESD circuit configured with three a-Si TFTs. Therefore, as shown in FIG. 13, consumption power when the gate driving circuit is in an off state can be reduced to 0.013 mW.

As another example, the ESD circuit having the 5TFT structure may be applied as the plurality of first ESD circuits 210 illustrated in FIG. 3. In this case, a channel length of each of the first and second center TFTs T2 and T4 of the ESD circuit having the 5TFT structure may be formed as 32 μm (4×8 μm).

When the channel length of each of the first and second center TFTs T2 and T4 of the ESD circuit having the 5TFT structure may be formed as 32 μm (4×8 μm), a size of each of the plurality of first ESD circuits 210 may be 342.5 μm.

Furthermore, the ESD circuit having the 7TFT structure may be applied as the plurality of second ESD circuits 220 illustrated in FIG. 3. In this case, a channel length of each of the first to third center TFTs T2, T4 and T6 of the ESD circuit having the 7TFT structure may be formed as 48 μm (6×8 μm).

When the channel length of each of the first to third center TFTs T2, T4 and T6 of the ESD circuit having the 7TFT structure may be formed as 48 μm (6×8 μm), a size of each of the plurality of second ESD circuits 220 may be 634.5 μm.

When the channel length of each of the first and second center TFTs T2 and T4 of the plurality of first ESD circuits 210 having the 5TFT structure is formed as 32 μm (4×8 μm), and a channel length of each of the first to third center TFTs T2, T4 and T6 of the plurality of second ESD circuits 220 having the 7TFT structure is formed as 48 μm (6×8 μm), a static current in an off state and an on state of the driving circuit can be reduced as shown in FIG. 13.

As described above, when the first ESD circuits 210 and the second ESD circuits 220 are provided, a static current can be reduced to a level lower than an ESD circuit configured with three a-Si TFTs. Therefore, as shown in FIG. 13, consumption power when the gate driving circuit is in an off state can be reduced to 0.010 mW.

The plurality of first ESD circuits of the LCD device according to an embodiment of the present invention include: a plurality of gate ESD circuits disposed between the plurality of gate lines and the common voltage line; and a plurality of data ESD circuits disposed between the plurality of data lines and the common voltage line.

In the LCD device according to an embodiment of the present invention, first terminals of the plurality of data ESD circuits are connected to the plurality of data lines, and second terminals are connected to the ground line.

In the LCD device according to an embodiment of the present invention, first terminals of the plurality of data ESD circuits are connected to the plurality of data lines, and second terminals are connected to the common voltage line.

The plurality of second ESD circuits of the LCD device according to an embodiment of the present invention include: a plurality of first protection circuits connected to the plurality of gate ESD circuits and the common voltage line; and a plurality of second protection circuits connected to the common voltage line or the common voltage line and the ground line.

In the LCD device according to an embodiment of the present invention, each of the plurality of first ESD circuits and the plurality of second ESD circuits is an oxide thin film transistor (TFT) having the same channel length as a channel length of a TFT provided in the display area.

In the LCD device according to an embodiment of the present invention, each of the plurality of first ESD circuits and the plurality of second ESD circuits includes: a plurality of switching thin film transistors (TFTs); and a plurality of center TFTs in which a plurality of TFTs having the same channel length as a channel length of a TFT provided in the active area are connected in series.

In the LCD device according to an embodiment of the present invention, the plurality of center TFTs are provided in a structure where two to seven TFTs are connected in series.

In the LCD device according to an embodiment of the present invention, the plurality of first ESD circuits include three switching TFTs and two center TFTs.

In the LCD device according to an embodiment of the present invention, in the plurality of first ESD circuits, the first center TFT is provided between the first switching TFT and the second switching TFT, and the second center TFT is provided between the second switching TFT and the third switching TFT.

In the LCD device according to an embodiment of the present invention, the plurality of second ESD circuits include three switching TFTs and two center TFTs, or include four switching TFTs and three center TFTs.

In the LCD device according to an embodiment of the present invention, in the plurality of second ESD circuits, the first center TFT is provided between the first switching TFT and the second switching TFT, the second center TFT is provided between the second switching TFT and the third switching TFT, and the third center TFT is provided between the third switching TFT and the fourth switching TFT.

The present invention provides an ESD circuit and an LCD device including the same, which decrease a static current.

The present invention provides an ESD circuit and an LCD device including the same, which decrease consumption power.

The present invention provides an ESD circuit and an LCD device including the same, which decrease a circuit area and enhance electrostatic discharge performance.

The present invention provides an ESD circuit which can be applied to a high-resolution display panel.

In the ESD circuit including the oxide TFT having the 5TFT structure or the 7TFT structure according to the embodiments of the present invention, a channel length of an oxide TFT is designed to be equal to a channel length of an oxide TFT in an active area (a display area), and thus, it is not required to separately change a channel design for the ESD circuit.

In the ESD circuit including the oxide TFT having the 5TFT structure or the 7TFT structure according to the embodiments of the present invention, a design area of a TFT can be reduced on a substrate, and thus, designing the ESD circuit is not limited.

In the ESD circuit including the oxide TFT having the 5TFT structure or the 7TFT structure according to the embodiments of the present invention, a static current and consumption power can be reduced to a level equal to an ESD circuit including three a-Si TFTs.

The ESD circuit including the oxide TFT having the 5TFT structure or the 7TFT structure according to the embodiments of the present invention may be applied to a high-resolution display panel.

In an aspect of the present invention, there is provided an electrostatic discharge (ESD) circuit including a transistor structure having at least five thin film transistors (TFTs), said transistor structure configured in view of changes in operating characteristics that depend on a channel length of a back channel etched (BCE) type oxide transistor.

Said transistor structure may include at least three switching thin film transistors (TFTs), each being an oxide TFT of a BCE type with an active layer of oxide; and at least two equalizer thin film transistors (TFTs), operatively connected with said switching TFTs, each equalizer TFT being an oxide TFT of a BCE type with an active layer of oxide and having a sequence of two or more oxide TFTs being connected together in series to achieve an effective channel length that is greater than a channel length of a single oxide TFT.

Said equalizer TFTs may include a first equalizer TFT having one end connected to a first switching TFT and having its other end connected to a second switching TFT, and a second equalizer TFT having one end connected to said second switching TFT and having its other end connected to a third switching TFT.

Said sequence of two or more oxide TFTs may share one gate electrode.

All of said switching TFTs and said equalizer TFTs may be located in a non-active area of a display panel.

Each switching TFT and each oxide TFT in each equalizer TFT may have the same structure as oxide TFTs in an active area of said display panel due to the same manufacturing process thereof.

Each oxide TFT in each equalizer TFT may have the same channel length as oxide TFTs in said active area of said display panel.

Each oxide TFT in each equalizer TFT may have substantially the same operating characteristic as oxide TFTs in said active area of said display panel.

In another aspect of the present invention, there is provided an apparatus including: a display panel having an active area including an array of pixels and having a non-active area surrounding the active area, with each pixel connected to at least one among a plurality of data lines, connected to at least one among a plurality of gate lines, and including one or more oxide thin film transistors (TFTs) that employ oxide as its active layer; and a plurality of electrostatic protection elements in the non-active area that inhibit electrostatic charges from flowing into the active area via the data lines or the gate lines, each electrostatic protection element including a plurality of oxide TFTs among which at least two oxide TFTs are center TFTs that respectively have an amalgamated structure with three of more individual oxide TFTs connected together in series to attain an elongated effective channel length.

The electrostatic protection elements may include: a first set of electrostatic circuits disposed at start portions and end portions of each of the gate lines and of each of the data lines; and a second set of electrostatic protection circuits disposed between a common voltage line and the first set of electrostatic protection circuits.

The second set of electrostatic protection circuits may include: a data protection circuit respectively disposed at each lower corner of the display panel, a first terminal thereof connected to the common voltage line and a second terminal thereof connected to ground, to protect the display panel from overvoltage currents.

The electrostatic protection elements including the plurality of oxide TFTs achieve a 5-TFT configuration may include: a first center TFT having one end connected to a first switching TFT and having its other end connected to a second switching TFT, and a second center TFT having one end connected to said second switching TFT and having its other end connected to a third switching TFT.

In an aspect of the present invention, there is provided a display device including: a pixel disposed in an active area of a display panel; and an electrostatic discharge (ESD) circuit disposed in a non-active area of the display panel, wherein, the ESD circuit comprises a first thin film transistor (TFT) configured to prevent a current from simultaneously flowing in two directions and a second TFT configured to divert an overvoltage current, and a channel length of the first TFT differs from a channel length of the second TFT.

The channel length of the first TFT may be equal to a channel length of a TFT disposed in the pixel, and the channel length of the second TFT may be longer than the channel length of the TFT disposed in the pixel.

A channel of the second TFT may include two or more channels which have the same length as a length of a channel of the TFT disposed in the pixel and are serially connected to each other.

The ESD circuit may include three first TFTs and two second TFTs, and each of the two second TFTs may be disposed between two first TFTs.

Each of the three first TFTs, the two second TFTs, and the TFT disposed in the pixel may be a back channel etched (BCE) type oxide TFT.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electrostatic discharge (ESD) circuit comprising a transistor structure having at least five thin film transistors (TFTs), said transistor structure being configured in view of changes in operating characteristics that depend on a channel length of a back channel etched (BCE) type oxide transistor.

2. The ESD circuit of claim 1, wherein said transistor structure comprises:
   at least three switching thin film transistors (TFTs), each being an oxide TFT of a BCE type with an active layer of oxide; and
   at least two equalizer thin film transistors (TFTs), operatively connected with said switching TFTs, each equalizer TFT being an oxide TFT of a BCE type with an active layer of oxide and having a sequence of two or more oxide TFTs being connected together in series to achieve an effective channel length that is greater than a channel length of a single oxide TFT.

3. The ESD circuit of claim 2, wherein said equalizer TFTs comprises:
   a first equalizer TFT having one end connected to a first switching TFT and having its other end connected to a second switching TFT, and
   a second equalizer TFT having one end connected to said second switching TFT and having its other end connected to a third switching TFT.

4. The ESD circuit of claim 2, wherein said sequence of two or more oxide TFTs share one gate electrode.

5. The ESD circuit of claim 2, wherein all of said switching TFTs and said equalizer TFTs are located in a non-active area of a display panel.

6. The ESD circuit of claim 5, wherein each switching TFT and each oxide TFT in each equalizer TFT have the same structure as that of oxide TFTs in an active area of said display panel due to the same manufacturing process thereof.

7. The ESD circuit of claim 6, each oxide TFT in each equalizer TFT has the same channel length as oxide TFTs in said active area of said display panel.

8. The ESD circuit of claim 6, each oxide TFT in each equalizer TFT has substantially the same operating characteristic as oxide TFTs in said active area of said display panel.

9. An apparatus comprising:
   a display panel having an active area including an array of pixels and having a non-active area surrounding the active area, with each pixel connected to at least one among a plurality of data lines, connected to at least one among a plurality of gate lines, and including one or more oxide thin film transistors (TFTs) that employ oxide as its active layer; and
   a plurality of electrostatic protection elements in the non-active area that inhibit electrostatic charges from flowing into the active area via the data lines or the gate lines,
   each electrostatic protection element including a plurality of oxide TFTs among which at least two oxide TFTs are center TFTs that respectively have an amalgamated structure with three of more individual oxide TFTs connected in series to attain an elongated effective channel length.

10. The apparatus of claim 9, the electrostatic protection elements comprising:
   a first set of electrostatic protection circuits disposed at start portions and end portions of each of the gate lines and of each of the data lines; and
   a second set of electrostatic protection circuits disposed between a common voltage line and the first set of electrostatic protection circuits.

11. The apparatus of claim 10, wherein the second set of electrostatic protection circuits includes:
   a data protection circuit respectively disposed at each lower corner of the display panel, a first terminal thereof connected to the common voltage line and a second terminal thereof connected to ground, to protect the display panel from overvoltage currents.

12. The apparatus of claim 11, wherein the electrostatic protection elements including the plurality of oxide TFTs achieve a 5-TFT configuration comprising:
a first center TFT having one end connected to a first switching TFT and having its other end connected to a second switching TFT, and a second center TFT having one end connected to said second switching TFT and having its other end connected to a third switching TFT.

13. A display device comprising:
a pixel disposed in an active area of a display panel; and
an electrostatic discharge (ESD) circuit disposed in a non-active area of the display panel,
wherein,
the ESD circuit comprises a first thin film transistor (TFT) configured to prevent a current from simultaneously flowing in two directions and a second TFT configured to divert an overvoltage current, and
a channel length of the first TFT differs from a channel length of the second TFT.

14. The display device of claim 13, wherein,
the channel length of the first TFT is equal to a channel length of a TFT disposed in the pixel, and
the channel length of the second TFT is longer than the channel length of the TFT disposed in the pixel.

15. The display device of claim 14, wherein a channel of the second TFT comprises two or more channels which have the same length as a length of a channel of the TFT disposed in the pixel and are serially connected to each other.

16. The display device of claim 14, wherein,
the ESD circuit comprises three first TFTs and two second TFTs, and
each of the two second TFTs is disposed between two first TFTs.

17. The display device of claim 16, wherein each of the three first TFTs, the two second TFTs, and the TFT disposed in the pixel is a back channel etched (BCE) type oxide TFT.

* * * * *